United States Patent [19]

Bernaud et al.

[11] Patent Number: 5,550,521
[45] Date of Patent: Aug. 27, 1996

[54] ELECTRICAL GROUND CONNECTION BETWEEN A COAXIAL CONNECTOR AND A MICROWAVE CIRCUIT BOTTOM PLATE

[75] Inventors: Maurice Bernaud, Asnieres; Freddy Maquet, Neuilly Sur Seine, both of France

[73] Assignee: Alcatel Telspace, Nanterre Cedex, France

[21] Appl. No.: 186,442

[22] Filed: Jan. 25, 1994

[30] Foreign Application Priority Data

Feb. 16, 1993 [FR] France .................................. 93 01709

[51] Int. Cl.$^6$ .................................................... H01P 1/04
[52] U.S. Cl. ........................ 333/260; 439/63; 439/386; 439/513; 439/581
[58] Field of Search .............................. 439/63, 386, 507, 439/513, 578, 581; 174/50.52, 59, 60; 333/33, 246, 260

[56] References Cited

U.S. PATENT DOCUMENTS 4,656,441   4/1987   Takahashi et al. ................... 439/63 X
5,198,786   3/1993   Russell et al. ..................... 333/246 X

FOREIGN PATENT DOCUMENTS 0003133    7/1979   European Pat. Off. .
0429037A1  5/1991   European Pat. Off. .
6931004    8/1969   Germany .
39101      3/1984   Japan ......................................... 439/63
174801     8/1986   Japan ......................................... 333/260
2181607    4/1987   United Kingdom .

OTHER PUBLICATIONS

Evans, *Annular Ring Coaxial Termination*, IBM Tech. Discl. Bulletin, vol. 16, No. 10, Mar. 1974. 333–260.

*Primary Examiner*—Paul Gensler
*Attorney, Agent, or Firm*—Sughrue, Mion, Zinn, Macpeak & Seas

[57] ABSTRACT

An electronic circuit is implemented on a substrate on an electrically conductive bottom plate fixed into an electromagnetic shield box. A coaxial socket is fixed to an outside wall of the shield box, the core of the socket being inserted in a hole in the wall in order to be connected to the electronic circuit. The socket has a grounding surface facing the wall. The grounding contact between the socket and the bottom plate is made by way of an electrically conductive ring coaxial with the core, insulated from the core and simultaneously in electrical contact with the grounding surface of the socket and the bottom plate when the socket is fixed to the wall of the box.

8 Claims, 3 Drawing Sheets

ELECTRICAL GROUND CONNECTION BETWEEN A COAXIAL CONNECTOR AND A MICROWAVE CIRCUIT BOTTOM PLATE

BACKGROUND OF THE INVENTION

1. Field of the Invention

The present invention relates to a system for making electrical contact between a coaxial plug or socket and a bottom plate of a microwave circuit enclosed in a shield box.

2. Description of the Prior Art

It is known for electronic circuits intended to operate at high frequencies to be implemented on a substrate, a PTFE-glass substrate, for example, in turn mounted on a conductive bottom plate, a brass bottom plate, for example. A circuit of this kind is then enclosed in an electromagnetic shield box and is electrically connected to surrounding devices by means of coaxial sockets fixed to the outside of the box, as shown in FIG. 1 which is a partial cross-section view of an electrical contact between a socket, which is an electrical connector, and an electronic circuit.

A socket connector 10 is fixed by screws 11 to a side wall 12 of an electromagnetic shielding box base. A microwave circuit comprising a conductive bottom plate 13 and a substrate 14 is fixed inside the base which includes a flange 15 all around its perimeter and cooperates with a lid 22 to form the box. The bottom plate 13 with the substrate 14 on top of it is fixed by screws (not shown) to the flange 15, which thus acts as its support.

The core or center conductor 16 of the socket 10 is partially enclosed by an insulative sheath 17, a PTFE sheath, for example, and is inserted in a hole 18 through the wall 12. After the socket 10 is screwed to the wall 12 the end of the core 16 is soldered to the substrate 14.

The main drawback of this electrical connection system is that the grounding contact to be made between the bottom plate 13 and the body of the socket 10 is made by way of the flange 15 and the interface 19 between the flange 15 and the bottom plate 13. The ground path 20 shown by a dashed line is long and requires an excellent contact at the interface 19.

Absorption of microwave energy is often observed when the grounding contact is established in this manner, especially at high frequencies, above a few GHz.

Another drawback of this connection system is that individual partitions 23 must be used if there is a requirement to separate microwave functions. Each partition 23 must then be screwed to the substrate 14 and provided on the edge facing the lid 22 with a microwave seal as there is necessarily some clearance between the lid 22 and the top of the partitions. The number of parts required to implement the microwave function is therefore large, as the partitions 23 cannot be part of the lid 22 or of the base.

To overcome this latter drawback the microwave circuit comprising the substrate on the conductive bottom plate may be fixed as shown in FIG. 2.

The microwave circuit is screwed on from underneath by the screws 25, in other words the substrate 14 bears against the flange 15. This makes it possible to reduce the number of mechanical parts used as the screening box comprises only a base 24 and the lid 22. The partitions 23 are an integral part of the base 24.

However, in this type of assembly the bottom plate 13 is no longer in electrical contact with the box, as previously. This contact can only be established indirectly, for example by plated-through holes on either side of the access microstrip line of the microwave circuit; they are then ineffective at microwave frequencies because they are too far away from this access line.

An object of the present invention is to overcome these various drawbacks.

To be more precise, one object of the invention is to provide a system for making an electrical ground connection between a conductive bottom plate of a microwave circuit contained in an electromagnetic shield box and a connection socket fixed to the exterior of said box.

Another object of the invention is to be provide a socket with which an electrical ground connection of this kind may be made.

SUMMARY OF THE INVENTION

These objects, along with others that emerge later, are achieved by a system for making an electrical connection between an electronic circuit implemented on a substrate on an electrically conductive bottom plate fixed into an electromagnetic shield box and a coaxial socket fixed to an outside wall of said shield box, the core of said socket being inserted in a hole in said wall in order to be connected to said electronic circuit, said socket having a grounding surface facing said wall, in which system the grounding contact between said socket and said bottom plate is made by way of an electrically conductive ring coaxial with said core, insulated from said core and simultaneously in electrical contact with said grounding surface of said socket and said bottom plate when said socket is fixed to said wall of said box.

This ensures ground continuity between the socket and the bottom plate and the electronic circuit.

In an advantageous embodiment of the invention the ring cooperates with an electrically conductive spring washer coaxial with the core of the socket between the grounding surface and the ring.

The ring may have some elasticity. To this end it may be made from a synthetic material charged with metal.

In another embodiment, which may be complementary to the previous embodiment, the coaxial socket is screwed to the wall of the box and each screw cooperates with a spring washer.

The use of elastic components such as washers allows for machining tolerances and deformation of the materials employed, due to a change of temperature causing thermal expansion, for example.

In a preferred application the box has a flange to which the substrate is fixed, the flange having a notch at the location of the hole in the wall providing access to the electronic circuit for the microstrip line.

In this way it is possible to make high-performance grounding contacts for circuits contained in boxes as shown in FIG. 2.

The ring advantageously has a flat adapted to be soldered to the bottom plate of the electronic circuit. This further improves the ground contact.

The invention also concerns an electrical connection device including a coaxial socket having a core and a grounding surface, this device comprising an electrically conductive ring insulated from the core and coaxial therewith.

Other features and advantages of the invention emerge from the following description of various preferred embodi-

DETAILED DESCRIPTION OF THE PREFERRED EMBODIMENTS

Figure 1:
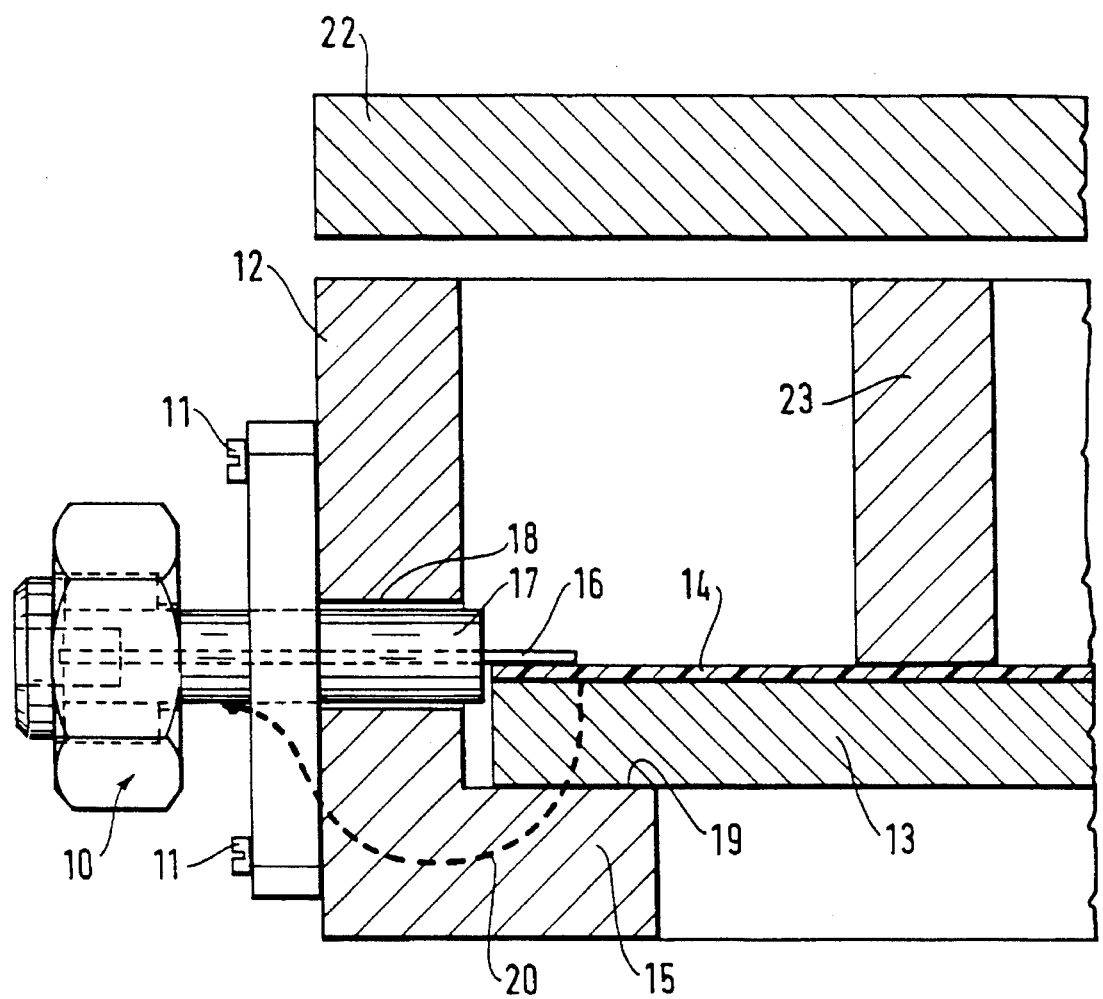
FIG. 1 is a partial cross-section view of an electrical contact between a socket and an electronic circuit contained in a shield box.
Figure 2:
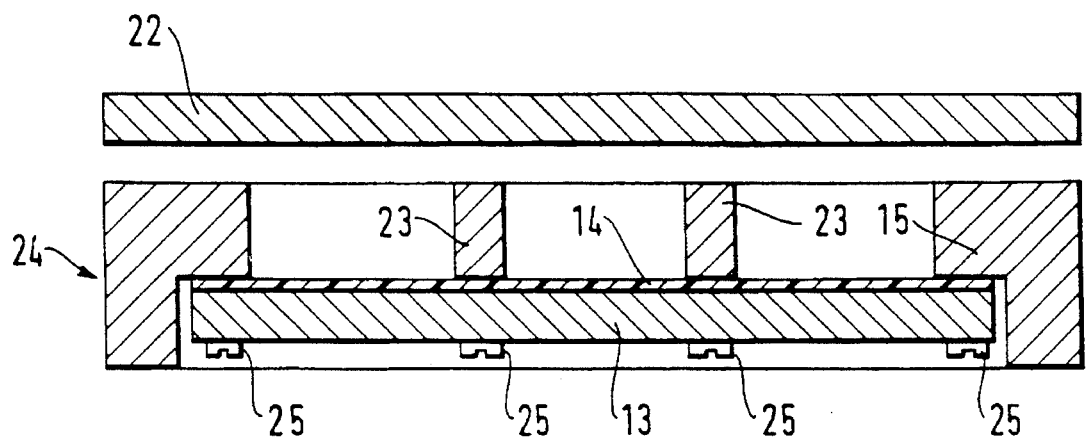
FIG. 2 is a diagram showing an advantageous method of fixing an electronic circuit in a shield box.

FIGS. 1 and 2 have already been described with reference to the prior art.

Figure 3:
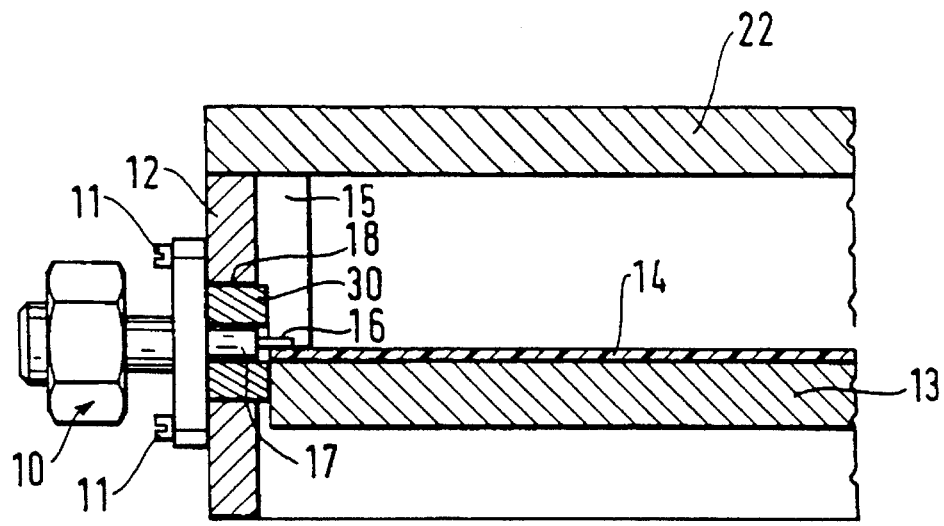
FIG. 3 is a partial cross-section view of a first preferred embodiment of the invention.

FIG. 3 shows a first preferred embodiment of the invention.

Figure 4:
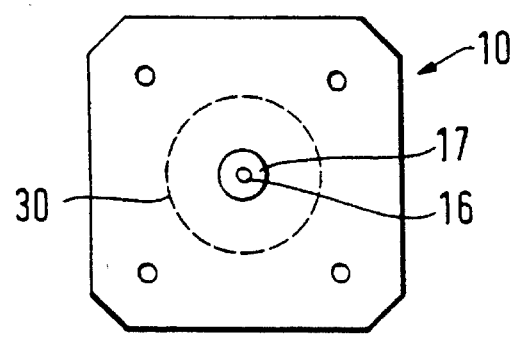
FIG. 4 is a rear view of a socket used in the present invention.

The electronic circuit implemented on the substrate 14 on the electrically conductive bottom plate 13 is fixed as before into an electromagnetic shield box. A coaxial socket or electrical connector 10 is fixed to the wall 12 of the shield box and the core or electrical connector 16 of the socket is inserted in a hole 18 drilled in this wall in order to be connected to the electronic circuit. As shown in FIG. 4, which is a rear view of the socket 10, the latter has a grounding surface near the core 16 insulated by a sheath 17. The sheath 17 is made from PTFE, for example.

According to the invention, the grounding contact between the socket 10 and the bottom plate 13 is made by way of an electrically conductive ring 30 coaxial with and insulated from the core 16 and simultaneously in electrical contact with the grounding surface of the socket 10 and the bottom plate 13 when the socket 10 is fixed to the wall 12. In FIG. 4 the position of the ring 30 is shown by a dashed line.

In this way the grounding of the socket 10 is extended through the wall 12 as far as the bottom plate 13. The grounding path is minimized and the electrical contact is optimized. The socket 10 is not necessarily in contact with the wall 12. As in the prior art the core 16 may be soldered directly to a track on the substrate 14.

In the FIG. 3 embodiment the ring 30 may be made from a material such as aluminum or brass and its length is calculated so that a good contact is established by deformation of the brass bottom plate.

It is equally possible to use a ring having some elasticity and to make it from a synthetic material charged with metal. The elasticity of the ring then provides an optimized ground contact.

Figure 5:
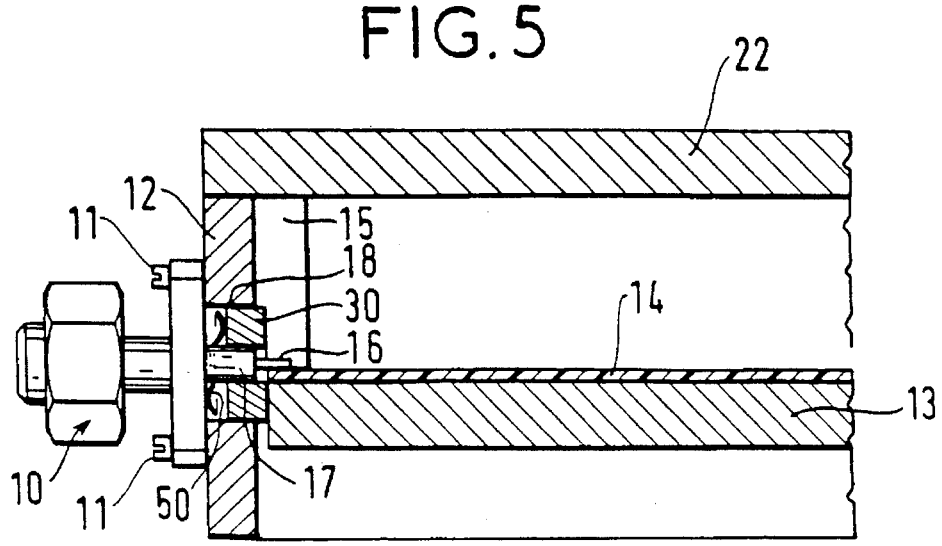
FIG. 5 shows a second preferred embodiment of the invention.

In another embodiment shown in FIG. 5 the ring 30 cooperates with a spring washer 50 coaxial with the core 16 between the grounding surface of the socket 10 and the ring 30. To ensure ground continuity the washer 50 and the ring 30 must be electrically conductive.

The washer 50 has an S-shape or cup-shape profile, for example. The elasticity of the washer 50 means that it is possible to tolerate some location clearance between the bottom plate 13 and the wall 12, the distance between the electronic circuit and the wall 12 usually being in the order of 0.1 mm. With the various components correctly sized, after the screws 11 are tightened the washer 50 is almost entirely flattened between the socket 10 and the ring 30.

Figure 6:
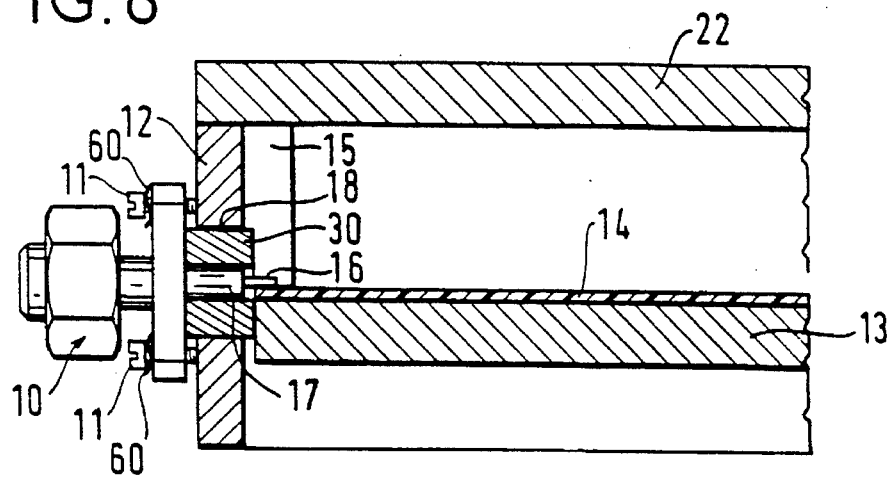
FIG. 6 shows a third preferred embodiment of the invention.

In a third embodiment shown in FIG. 6 each screw 11 fixing the socket 10 to the wall 12 cooperates with a spring washer 60. The usual number of screws is four and the same effect is obtained as with the arrangement from FIG. 5.

Note that the arrangements of FIGS. 5 and 6 are particularly well suited to environments in which the components employed may change in size, for example expand. The use of elastic components allows for these changes and ensures an optimized grounding contact at all times.

Figure 7:
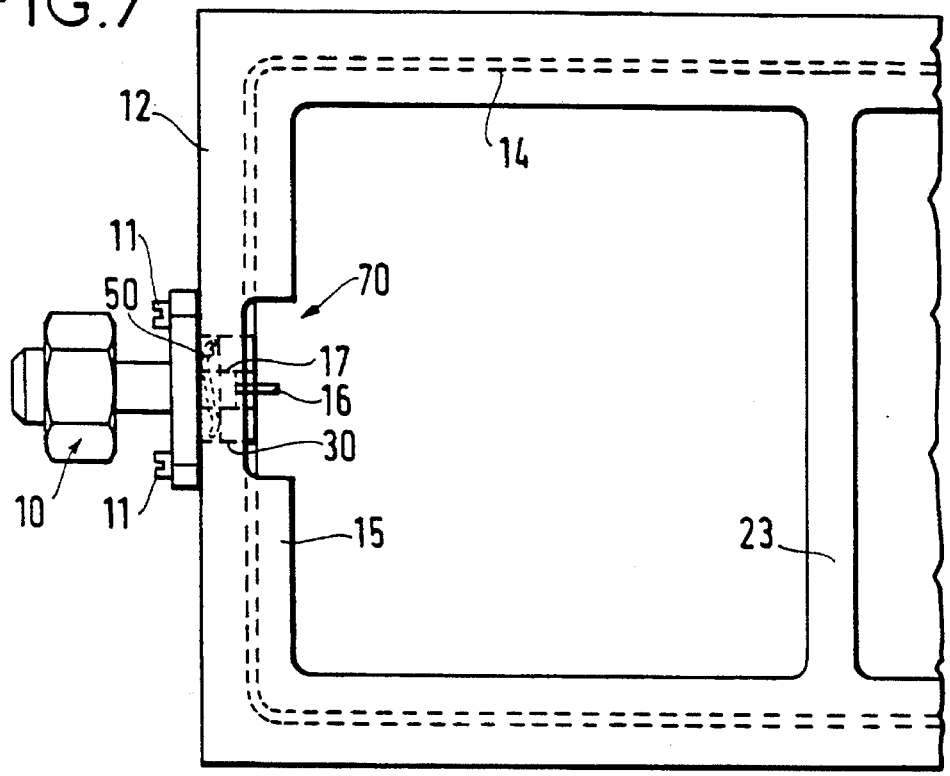
FIG. 7 is a top view of a base fitted with the electrical connection device of the invention.

FIG. 7 is a top view of part of a shield box not covered by a lid like the lid 22 in FIG. 2. In FIG. 7 the electrical connection device in accordance with the invention is of the type shown in FIG. 5.

The base of the shield box includes the flange 15 to which the substrate 14 is screwed. At the location of the socket 10 the flange 15 has a notch 70 at the location of the hole in the wall 12 providing access to the microstrip line on the substrate 14. This figure shows the construction of the base which is formed with partitions 23, etc for separating the microwave electronic functions.

It is also feasible to manufacture sockets incorporating an extension forming a ring insulated from the core.

With reference to the materials used, the bottom plate of the electronic circuit may be of brass, copper or aluminum and the ring is preferably made from brass or aluminum. The length of the ring is in the order of 3.5 mm and its diameter is 2.2 or 4.15 mm, for example, depending on the socket used, in order to maintain the same characteristic impedance.

Figure 8:
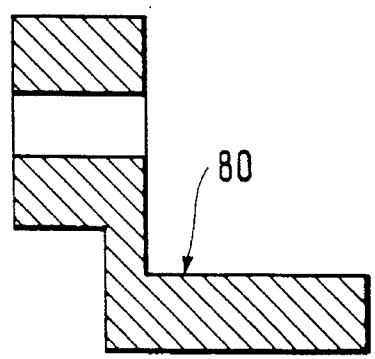
FIG. 8 is a cross-section view of another embodiment of a ring.

FIG. 8 is a cross-section view of another embodiment of a ring that can be used in the present invention.

This ring has a flat 80 so that it can be soldered to the bottom plate of the electronic circuit in the box. This further improves the grounding electrical contact.

There is claimed:

1. A system for making an electrical connection between an electronic circuit implemented on a substrate on an electrically conductive bottom plate fixed into an electromagnetic shield box and a coaxial connector fixed to an outside wall of said shield box, the center conductor of said coaxial connector being inserted in a hole in said wall in order to be connected to said electronic circuit, said coaxial connector having a grounding surface facing said wall and an electrically conductive ring coaxial with said center conductor, the grounding contact between said coaxial connector and said bottom plate is made axially of said electrically conductive ring, said electrically conductive ring being insulated from said center conductor and simultaneously in electrical contact axially with said grounding surface of said coaxial connector and said bottom plate with said coaxial connector being fixed to said wall of said box.

2. System according to claim 1 wherein said ring cooperates with an electrically conductive spring washer coaxial with said center conductor between said grounding surface and said ring.

3. A system according to claim 1, wherein said ring is elastic.

4. A system according to claim 3, wherein said elastic ring is made from a synthetic material charged with metal.

5. System according to claim 1 wherein said coaxial conductor is fixed to said wall of said box by screws and each screw cooperates with a spring washer.

6. System according to claim 1 wherein said box has a flange to which said substrate is fixed and having a notch at the location of said hole in said wall to provide access to a microstrip access line of said electronic circuit.

7. System according to claim 1 wherein said ring has a flat adapted to be soldered to said bottom plate.

8. A system as claimed in claim 1, wherein said electrically conductive ring includes first and second surfaces, each of which being transverse of an axis of said ring, said first and second surfaces simultaneously physically and electrically contacting said grounding surface and said bottom plate, respectively.

\* \* \* \* \*